(12) United States Patent
Kuraguchi et al.

(10) Patent No.: US 11,362,653 B2
(45) Date of Patent: Jun. 14, 2022

(54) SEMICONDUCTOR DEVICE

(71) Applicant: KABUSHIKI KAISHA TOSHIBA, Tokyo (JP)

(72) Inventors: Masahiko Kuraguchi, Yokohama (JP); Yosuke Kajiwara, Yokohama (JP); Kentaro Ikeda, Kawasaki (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 40 days.

(21) Appl. No.: 17/018,009

(22) Filed: Sep. 11, 2020

(65) Prior Publication Data

US 2021/0218394 A1 Jul. 15, 2021

(30) Foreign Application Priority Data

Jan. 9, 2020 (JP) .............................. JP2020-001869

(51) Int. Cl.

| | |
|---|---|
| *H03K 17/22* | (2006.01) |
| *H01L 27/07* | (2006.01) |
| *H03K 17/687* | (2006.01) |
| *H03K 17/30* | (2006.01) |
| *H01L 29/778* | (2006.01) |

(52) U.S. Cl.
CPC ........ *H03K 17/223* (2013.01); *H01L 27/0711* (2013.01); *H01L 29/778* (2013.01); *H03K 17/302* (2013.01); *H03K 17/687* (2013.01)

(58) Field of Classification Search
CPC ...... H03K 17/22; H03K 17/223; H03K 17/30; H03K 17/302; H03K 17/687; H01L 27/0711; H01L 29/778
See application file for complete search history.

(56) References Cited

U.S. PATENT DOCUMENTS

| | | | |
|---|---|---|---|
| 6,903,383 B2 | 6/2005 | Yokogawa et al. | |
| 2009/0206363 A1* | 8/2009 | Machida ............. | H01L 27/0727 257/133 |

(Continued)

FOREIGN PATENT DOCUMENTS

| | | | | |
|---|---|---|---|---|
| CN | 104348461 A | * | 2/2015 | ............. H03K 17/08 |
| JP | 2002-222817 A | | 8/2002 | |

(Continued)

*Primary Examiner* — Matthew E Warren
(74) *Attorney, Agent, or Firm* — Oblon, McClelland, Maier & Neustadt, L.L.P.

(57) ABSTRACT

According to one embodiment, a semiconductor device includes a semiconductor member, a gate electrode, a source electrode, a drain electrode, a conductive member, a gate terminal, and a first circuit. The semiconductor member includes a first semiconductor layer including a first partial region and including $Al_{x1}Ga_{1-x1}N$ ($0 \le x1 \le 1$), and a second semiconductor layer including $Al_{x2}Ga_{1-x2}N$ ($0 < x2 \le 1$ and $x1 < x2$). The first partial region is between the gate electrode and at least a portion of the conductive member in a first direction. The gate terminal is electrically connected to the gate electrode. The first circuit is configured to apply a first voltage to the conductive member based on a gate voltage applied to the gate terminal. The first voltage has a reverse polarity of a polarity of the gate voltage.

19 Claims, 15 Drawing Sheets

(56) References Cited

U.S. PATENT DOCUMENTS

| | | | | |
|---|---|---|---|---|
| 2009/0267078 A1* | 10/2009 | Mishra | ............... | H01L 29/0847 |
| | | | | 257/76 |
| 2011/0286430 A1 | 11/2011 | Zembutsu et al. | | |
| 2013/0341641 A1* | 12/2013 | Nishiwaki | ........... | H01L 21/8258 |
| | | | | 257/77 |
| 2014/0375372 A1* | 12/2014 | Ikeda | ............... | H03K 17/04163 |
| | | | | 327/333 |
| 2015/0371987 A1* | 12/2015 | Pan | .................... | H03K 17/6871 |
| | | | | 257/76 |
| 2017/0077925 A1 | 3/2017 | Naka | | |
| 2018/0269290 A1 | 9/2018 | Shindome et al. | | |

FOREIGN PATENT DOCUMENTS

| | | |
|---|---|---|
| JP | 2007-128994 A | 5/2007 |
| JP | WO2011/064955 A1 | 6/2011 |
| JP | 2012-195348 A | 10/2012 |
| JP | 2017-055071 A | 3/2017 |
| JP | 2018-157100 A | 10/2018 |
| JP | 2019-009321 A | 1/2019 |

\* cited by examiner

SEMICONDUCTOR DEVICE

CROSS-REFERENCE TO RELATED APPLICATIONS

This application is based upon and claims the benefit of priority from Japanese Patent Application No. 2020-001869, filed on Jan. 9, 2020; the entire contents of which are incorporated herein by reference.

FIELD

Embodiments of the invention generally relate to a semiconductor device.

BACKGROUND

For example, it is desirable to improve the characteristics of a semiconductor device such as a transistor or the like.

DETAILED DESCRIPTION

Figure 1:
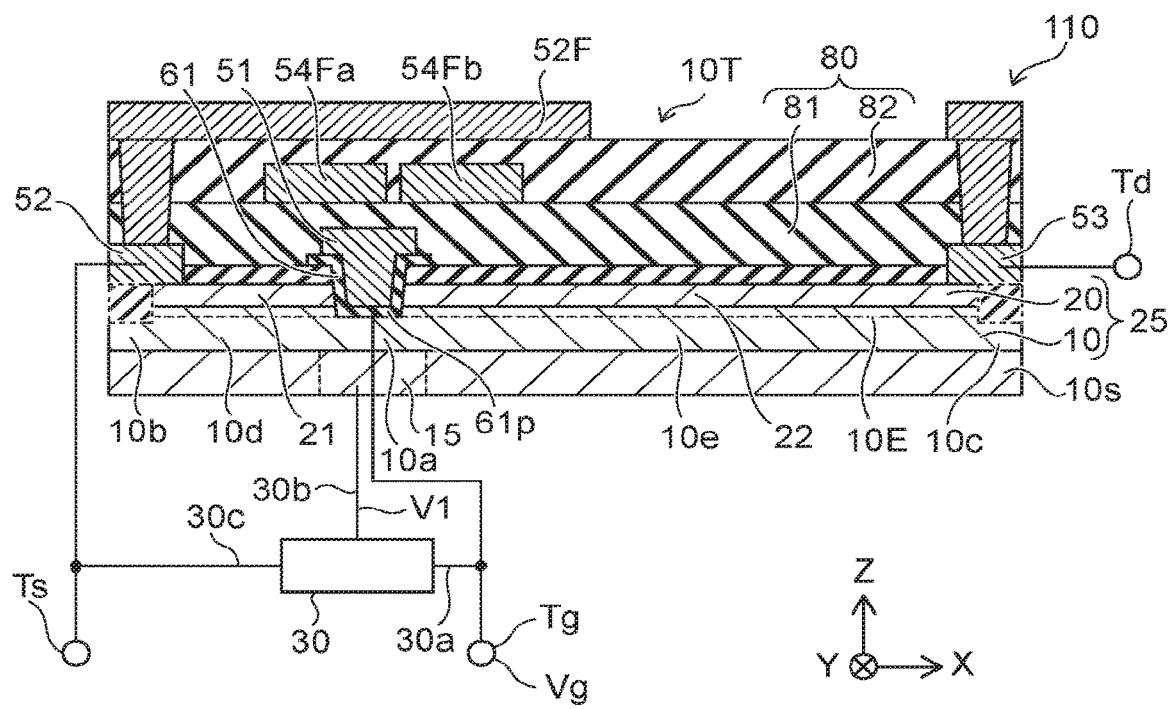
FIG. 1 is a schematic view illustrating a semiconductor device according to a first embodiment.

According to one embodiment, a semiconductor device includes a semiconductor member, a gate electrode, a source electrode, a drain electrode, a conductive member, a gate terminal, and a first circuit. The semiconductor member includes a first semiconductor layer including a first partial region and including $Al_{x1}Ga_{1-x1}N$ ($0 \leq x1 < 1$), and a second semiconductor layer including $Al_{x2}Ga_{1-x2}N$ ($0 < x2 \leq 1$ and $x1 < x2$). The first partial region is between the gate electrode and at least a portion of the conductive member in a first direction. The gate terminal is electrically connected to the gate electrode. The first circuit is configured to apply a first voltage to the conductive member based on a gate voltage applied to the gate terminal. The first voltage has a reverse polarity of a polarity of the gate voltage.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1 is a schematic view illustrating a semiconductor device according to a first embodiment.

As shown in FIG. 1, the semiconductor device 110 according to the embodiment includes a semiconductor member 25, a gate electrode 51, a source electrode 52, a drain electrode 53, a conductive member 15, a gate terminal Tg, and a first circuit 30. The semiconductor member 25, the gate electrode 51, the source electrode 52, the drain electrode 53, and the conductive member 15 are included in a transistor 10T. FIG. 1 illustrates a cross section of the transistor 10T.

The semiconductor member 25 includes a first semiconductor layer 10 and a second semiconductor layer 20. The first semiconductor layer 10 includes a first partial region 10a. The first semiconductor layer 10 includes $A_{x1}Ga_{1-x1}N$ ($0 \leq x1 < 1$). The Al composition ratio in the first semiconductor layer 10 is, for example, 0.1 or less. The first semiconductor layer 10 includes, for example, GaN.

The second semiconductor layer 20 includes $Al_{x2}Ga_{1-x2}N$ ($0 < x2 \leq 1$ and $x1 < x2$). The Al composition ratio in the second semiconductor layer 20 is, for example, not less than 0.2 and not more than 0.5. The second semiconductor layer 20 includes, for example, AlGaN.

A base body 10s is provided in the example. The base body 10s is, for example, a silicon substrate. A buffer layer (e.g., a buffer layer 10B illustrated in FIG. 14) may be provided between the base body 10s and the first semiconductor layer 10. For example, the buffer layer is provided on the base body 10s. The first semiconductor layer 10 is provided on the buffer layer. The second semiconductor layer 20 is provided on the first semiconductor layer 10.

For example, the first partial region 10a of the first semiconductor layer 10 is between the gate electrode 51 and at least a portion of the conductive member 15 in a first direction.

For example, the first direction corresponds to the stacking direction of the first and second semiconductor layers 10 and 20. The first direction is taken as a Z-axis direction. One direction perpendicular to the Z-axis direction is taken as an X-axis direction. A direction perpendicular to the Z-axis direction and the X-axis direction is taken as a Y-axis direction.

In the example, the conductive member 15 is a portion of the base body 10s (e.g., the silicon substrate). The conductive member 15 spreads along a plane (the X-Y plane) crossing the first direction (the Z-axis direction). A portion of the first semiconductor layer 10 is between the source electrode 52 and a portion of the conductive member 15 (the base body 10s) in the first direction (the Z-axis direction). Another portion of the first semiconductor layer 10 is between the drain electrode 53 and another portion of the conductive member 15 (the base body 10s) in the first direction.

As shown in FIG. 1, a second direction from the source electrode 52 toward the drain electrode 53 crosses the first direction (the Z-axis direction). For example, the second direction is the X-axis direction. The position in the second direction (e.g., the X-axis direction) of the gate electrode 51 is between the position in the second direction of the source electrode 52 and the position in the second direction of the drain electrode 53.

As shown in FIG. 1, for example, the first semiconductor layer 10 further includes a second partial region 10b, a third partial region 10c, a fourth partial region 10d, and a fifth partial region 10e. The direction from the second partial region 10b toward the source electrode 52 is along the first direction (the Z-axis direction). The direction from the third partial region 10c toward the drain electrode 53 is along the first direction.

The first partial region 10a is between the second partial region 10b and the third partial region 10c in the second direction (e.g., the X-axis direction). The fourth partial region 10d is between the second partial region 10b and the first partial region 10a in the second direction. The fifth partial region 10e is between the first partial region 10a and the third partial region 10c in the second direction.

The second semiconductor layer 20 includes a first semiconductor portion 21 and a second semiconductor portion 22. The direction from the fourth partial region 10d toward the first semiconductor portion 21 is along the first direction (the Z-axis direction). The direction from the fifth partial region 10e toward the second semiconductor portion 22 is along the first direction.

In the example, the semiconductor device 110 further includes a first insulating film 61. A portion 61p of the first insulating film 61 is between the first partial region 10a and the gate electrode 51. For example, at least a portion of the first insulating film 61 is between the first partial region 10a and the gate electrode 51. The first insulating film 61 functions as a gate insulating film. The first insulating film 61 includes, for example, silicon oxide.

For example, a carrier region 10E is formed in a portion of the first semiconductor layer 10 proximate to the second semiconductor layer 20. The carrier region 10E is, for example, a two-dimensional electron gas. The semiconductor device 110 is, for example, a HEMT (High Electron Mobility Transistor).

For example, a source terminal Ts and a drain terminal Td may be provided. The source terminal Ts is electrically connected to the source electrode 52. The drain terminal Td is electrically connected to the drain electrode 53.

The gate terminal Tg is electrically connected to the gate electrode 51. A current that flows between the source terminal Ts and the drain terminal Td is controlled according to a voltage applied to the gate terminal Tg.

In the example, the direction from the portion 61p of the first insulating film 61 toward the first semiconductor layer 10 is perpendicular to the first direction (the Z-axis direction). For example, the direction from at least a portion of the gate electrode 51 toward at least a portion of the second semiconductor layer 20 is perpendicular to the first direction (the Z-axis direction). The semiconductor device 110 may have a normally-off operation. In the embodiment, the direction from at least a portion of the gate electrode 51 toward at least a portion of the first semiconductor layer 10 may be perpendicular to the first direction.

As shown in FIG. 1, the semiconductor device 110 may include at least one of a field plate 52F, a field plate 54Fa, or a field plate 54Fb. For example, at least one of these field plates is electrically connected to the source electrode 52. For example, the gate electrode 51 is between the semiconductor member 25 and the field plate 52F. For example, the field plate 54Fa is between the gate electrode 51 and the field plate 52F. For example, the position of the field plate 54Fb in the Z-axis direction is between the position of the gate electrode 51 in the Z-axis direction and the position of the field plate 52F in the Z-axis direction.

For example, the semiconductor device 110 may further include an insulating member 80. The insulating member 80 electrically insulates the gate electrode 51 and the source electrode 52. The insulating member 80 electrically insulates the gate electrode 51 and the drain electrode 53. The insulating member 80 electrically insulates the drain electrode 53 and the source electrode 52. The insulating member 80 may include, for example, a first insulating member 81 and a second insulating member 82. The first insulating member 81 is between the gate electrode 51 and the field plate 54Fa. The second insulating member 82 is between the field plate 54Fa and the field plate 52F. The insulating member 80 includes at least one selected from the group consisting of silicon oxide, silicon nitride, silicon oxynitride, and aluminum oxide.

The first circuit 30 is configured to apply a first voltage V1 to the conductive member 15 based on a gate voltage Vg applied to the gate terminal Tg. The first voltage V1 has the reverse polarity of the polarity of the gate voltage Vg.

For example, the first circuit 30 includes a first end 30a, a second end 30b, and a third end 30c. The first end 30a is electrically connected to the gate terminal Tg. The second end 30b is electrically connected to the conductive member 15. The third end 30c is electrically connected to the source terminal Ts (i.e., the source electrode 52).

For example, the source electrode 52 is set to a ground potential. For example, a negative first voltage V1 is generated from a positive gate voltage Vg. The threshold voltage can be increased by applying the negative first voltage V1 to the conductive member 15 that faces the gate electrode 51.

According to the embodiment, a stable and high threshold voltage is easily obtained.

For example, compared to when the voltage of the conductive member 15 is 0 volts, a threshold voltage that is about 1 V higher is obtained when the first voltage V1 applied to the conductive member 15 is −10 V.

According to the embodiment, a semiconductor device can be provided in which the characteristics can be improved.

Second Embodiment

A second embodiment corresponds to one example of the first circuit 30 illustrated in FIG. 1.

Figure 2:
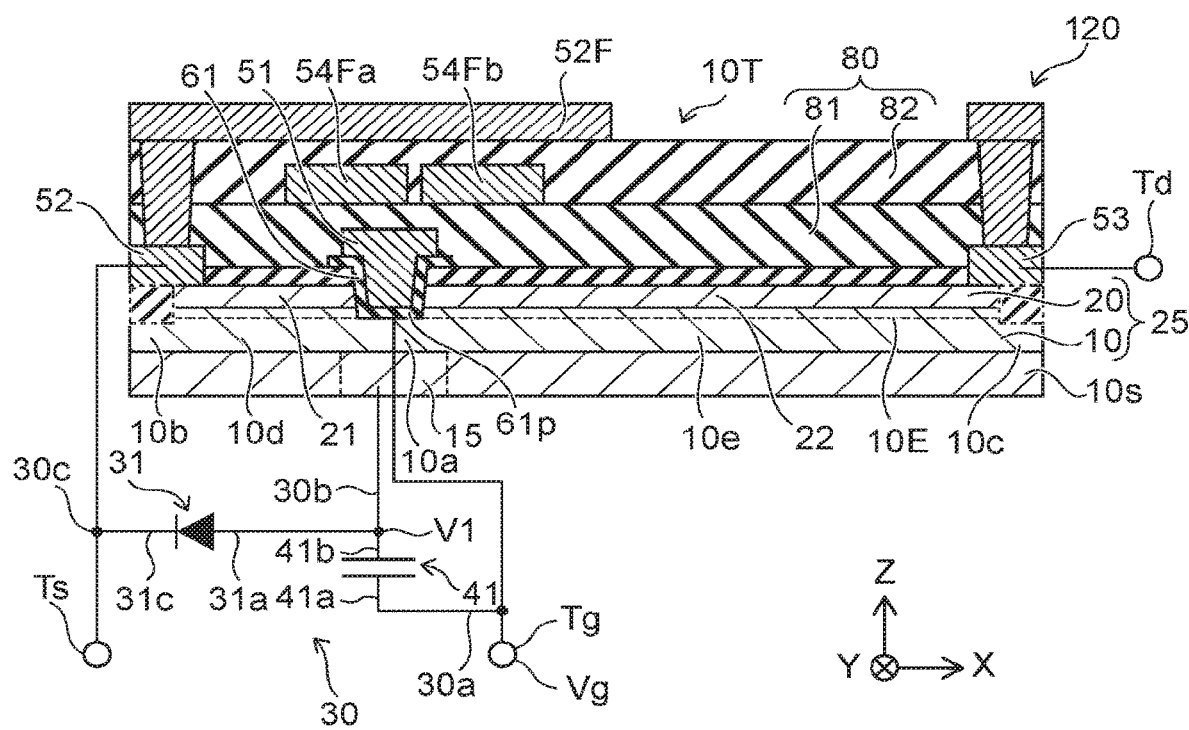
FIG. 2 is a schematic view illustrating a semiconductor device according to a second embodiment.

FIG. 2 is a schematic view illustrating a semiconductor device according to the second embodiment.

Figure 3:
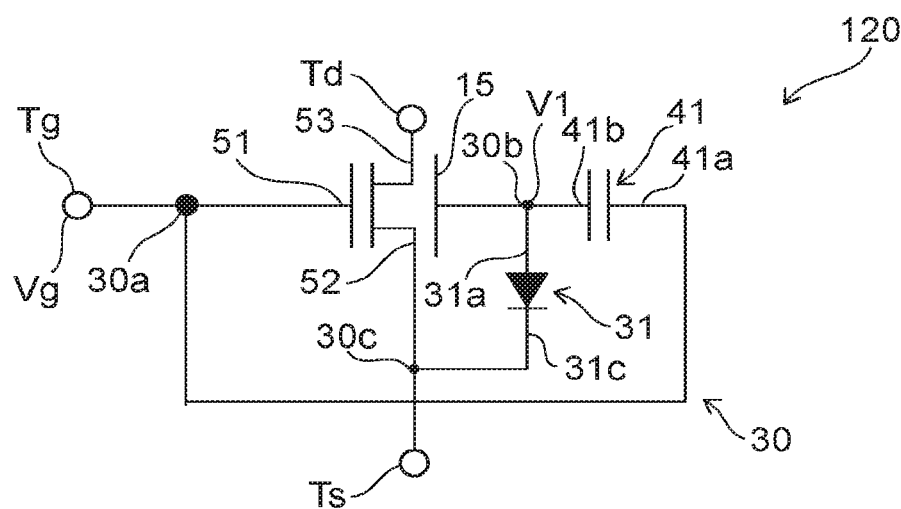
FIG. 3 is a circuit diagram illustrating the semiconductor device according to the second embodiment.

FIG. 3 is a circuit diagram illustrating the semiconductor device according to the second embodiment.

As shown in FIG. 2, the configurations of the semiconductor member 25, the gate electrode 51, the source electrode 52, the drain electrode 53, the conductive member 15, the gate terminal Tg, etc., of the semiconductor device 120 according to the embodiment are similar to those of the semiconductor device 110. An example of the first circuit 30 of the semiconductor device 120 will now be described.

As shown in FIGS. 2 and 3, the first circuit 30 includes a first capacitance 41 and a first diode 31. The first capacitance 41 includes a first end portion 41a and a second end portion 41b. The first diode 31 includes a first anode 31a and a first cathode 31c.

The first end portion 41a is electrically connected to the gate terminal Tg. The second end portion 41b is electrically connected to the conductive member 15 and the first anode 31a. The first cathode 31c is electrically connected to the source electrode 52.

For example, the first end portion 41a corresponds to the first end 30a. The second end portion 41b corresponds to the second end 30b. The first cathode 31c corresponds to the third end 30c.

The first circuit 30 that has such a configuration generates the first voltage V1 from the gate voltage Vg.

Figure 4A:
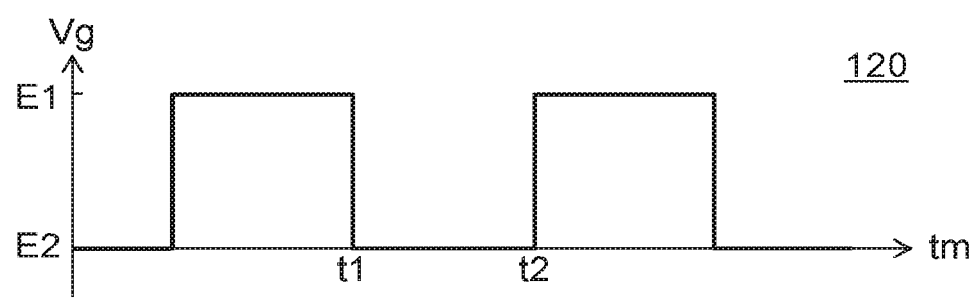
FIGS. 4A and 4B are graphs illustrating an operation of the semiconductor device according to the second embodiment.
Figure 4B:
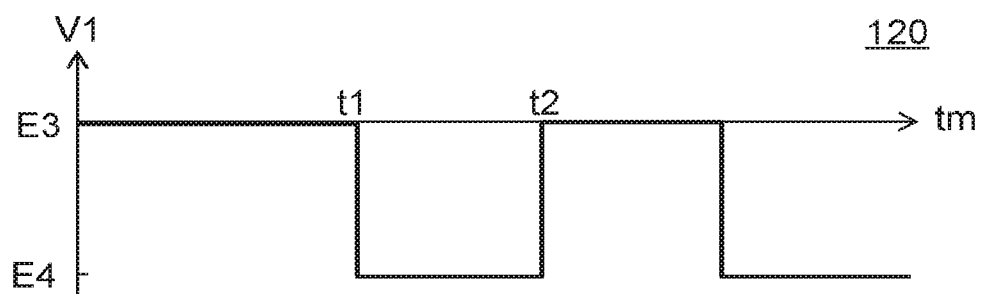

FIGS. 4A and 4B are graphs illustrating an operation of the semiconductor device according to the second embodiment.

In these figures, the horizontal axis is a time tm. The vertical axis of FIG. 4A is the gate voltage Vg applied to the gate terminal Tg. The vertical axis of FIG. 4B is the first voltage V1 applied to the conductive member 15.

As shown in FIG. 4A, the gate voltage Vg changes from a first potential E1 to a second potential E2 at a first time t1. The second potential E2 is less than the first potential E1.

As shown in FIG. 4B, the first voltage V1 changes from a third potential E3 to a fourth potential E4 at the first time t1. The change of the potential is based on the charge stored in the first capacitance 41. The fourth potential E4 is less than the third potential E3. The second potential E2 and the third potential E3 are, for example, the ground potential. The first voltage V1 that is output from the first circuit 30 changes to the negative fourth potential E4 when the gate voltage Vg changes from the positive first potential E1 to the ground potential.

Thus, the first voltage V1 changes from the third potential E3 to the fourth potential E4 when the gate voltage Vg changes from the first potential E1 (the high potential) to the second potential E2 (the low potential). A high threshold voltage is obtained by the conductive member 15 changing to the negative fourth potential E4.

In the embodiment, the first circuit 30 generates the first voltage V1 from the gate voltage Vg. For example, the configuration is simple compared to a reference example in which a control device or the like is separately provided. In the embodiment, a high threshold can be stably obtained with a simple configuration.

In the example as shown in FIGS. 4A and 4B, the polarity of the first voltage V1 is reversed with respect to the polarity of the gate voltage Vg at and after the first time t1. For example, the gate voltage Vg changes from the second potential E2 to the first potential E1 at a second time t2. The first voltage V1 changes from the fourth potential E4 to the third potential E3 at the second time t2. For example, the threshold reverts when the gate voltage Vg is in the on-state, and a low on-resistance is obtained.

Thus, in one example according to the embodiment, the first voltage V1 may change from the fourth potential E4 to the third potential E3 when the gate voltage Vg changes from the second potential E2 to the first potential E1.

In the embodiment, an electrostatic capacitance is generated between the conductive member 15 and the gate electrode 51. For example, the electrostatic capacitance corresponds to the electrostatic capacitance between the base body 10s (the silicon substrate) and the carrier region 10E.

In the embodiment, it is favorable for a first electrostatic capacitance of the first capacitance 41 to be not less than 10 times the electrostatic capacitance between the gate electrode 51 and the conductive member 15 (which may be, for example, the base body 10s). The fourth potential E4 can be further reduced thereby, and a high threshold voltage is obtained.

Figure 5:
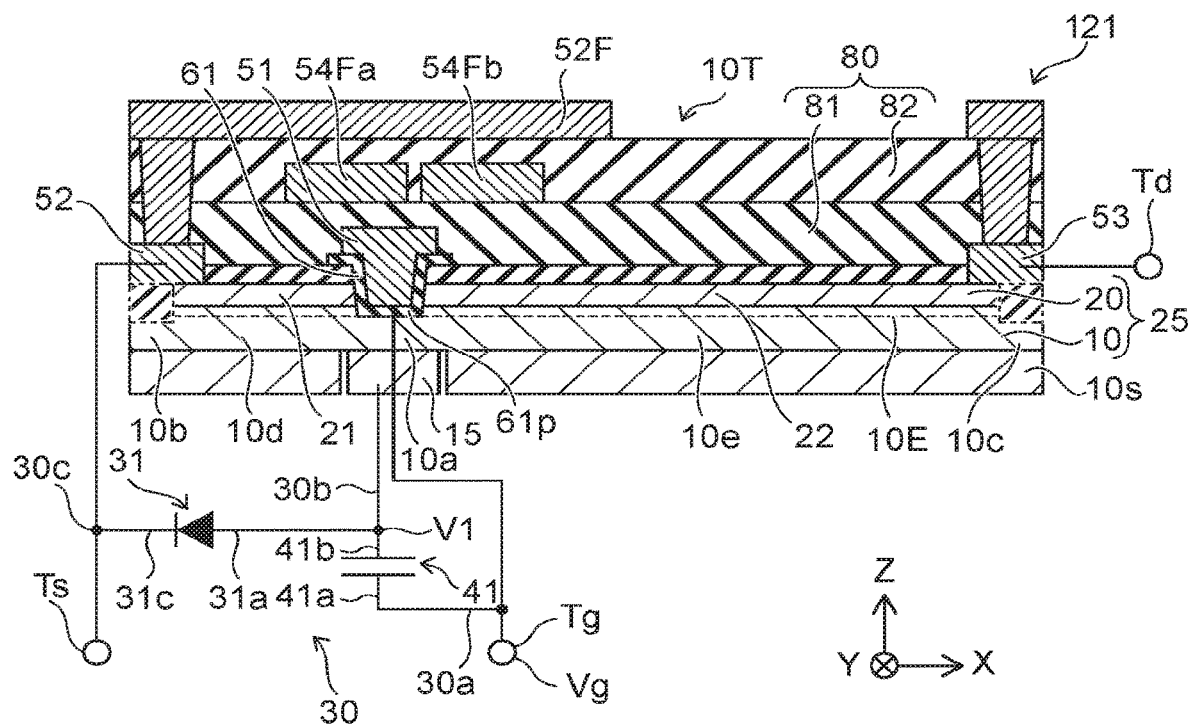
FIG. 5 is a schematic view illustrating a semiconductor device according to the second embodiment.

FIG. 5 is a schematic view illustrating a semiconductor device according to the second embodiment.

Figure 6:
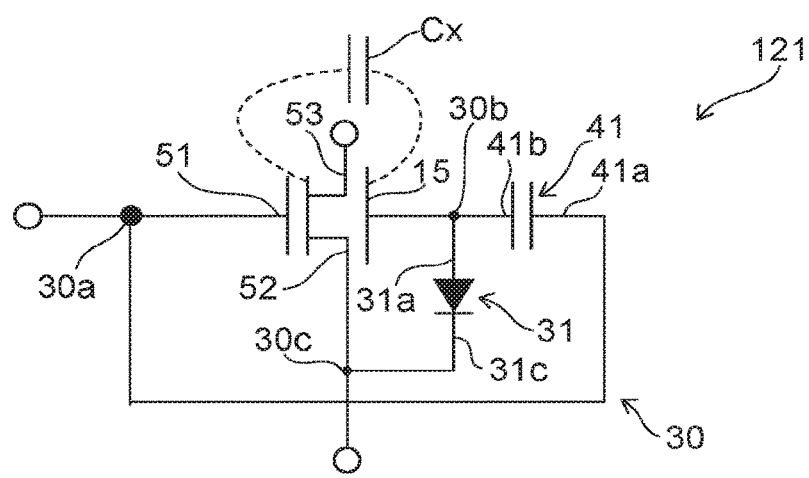
FIG. 6 is a circuit diagram illustrating the semiconductor device according to the second embodiment.

FIG. 6 is a circuit diagram illustrating the semiconductor device according to the second embodiment.

As shown in FIG. 5, the configurations of the semiconductor member 25, the gate electrode 51, the source electrode 52, the drain electrode 53, the gate terminal Tg, the first circuit 30, etc., of the semiconductor device 121 are similar to those of the semiconductor device 120. An example of the conductive member 15 of the semiconductor device 121 will now be described.

In the semiconductor device 121 as shown in FIG. 5, the conductive member 15 is separated from the base body 10s (e.g., the silicon substrate). For example, the conductive member 15 that is separated from the base body 10s is obtained by performing etching or the like to remove a region between the portion of the base body 10s corresponding to the gate electrode 51 and the other portions of the base body 10s.

Or, the conductive member 15 that is separated from the base body 10s is obtained by removing the portion of the base body 10s corresponding to the gate electrode 51 and by providing another conductive layer (a metal layer, etc.) in the removed portion.

In the semiconductor device 121, because the conductive member 15 is separated from the base body 10s, an electrostatic capacitance Cx between the conductive member 15 and the gate electrode 51 (referring to FIG. 6) can be small. Thereby, the potential of the electrostatic capacitance Cx can change in a short period of time. Even when the electrostatic capacitance of the first capacitance 41 is small, the delay of the threshold voltage increase with respect to the change of the gate voltage Vg can be suppressed.

Figure 7:
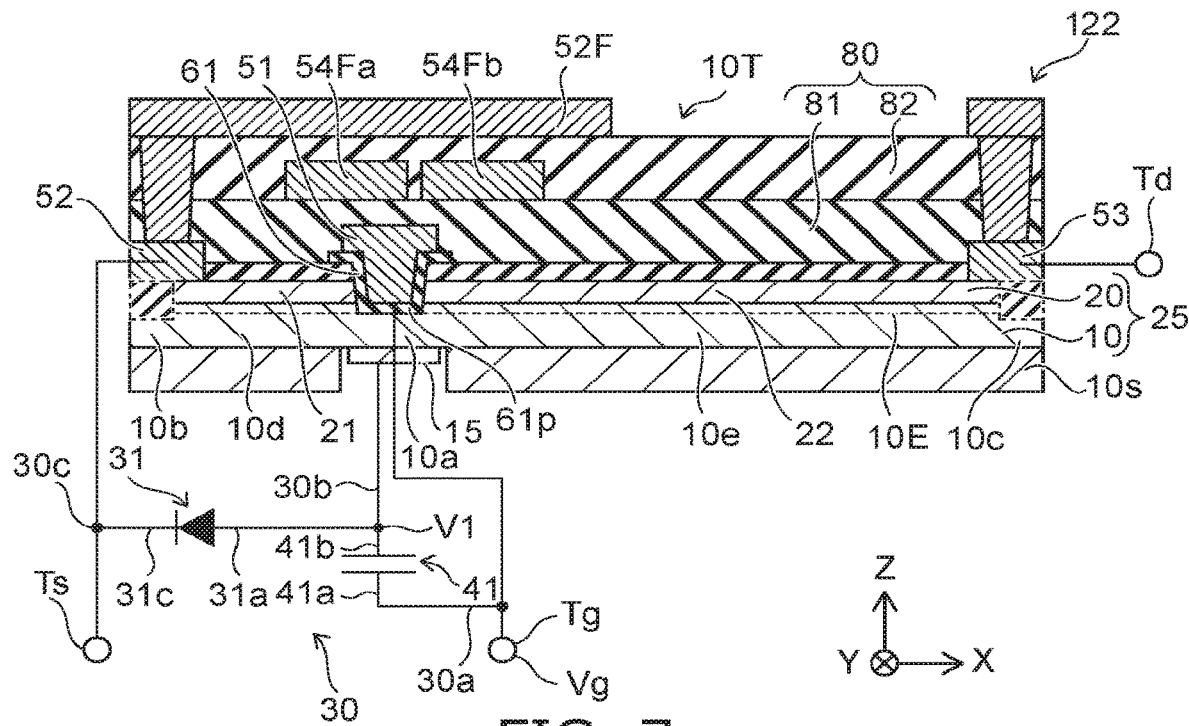
FIG. 7 is a schematic view illustrating a semiconductor device according to the second embodiment.

FIG. 7 is a schematic view illustrating a semiconductor device according to the second embodiment.

As shown in FIG. 7, the configurations of the semiconductor member 25, the gate electrode 51, the source electrode 52, the drain electrode 53, the gate terminal Tg, the first circuit 30, etc., of the semiconductor device 122 are similar to those of the semiconductor device 120. In the semiconductor device 122 as well, the conductive member 15 is separated from the base body 10s (e.g., the silicon substrate).

In the semiconductor device 122, the thickness (the length along the Z-axis direction) of the conductive member 15 is different from the thickness of the base body 10s. In the example, the thickness of the conductive member 15 is less than the thickness of the base body 10s. In such a semiconductor device 122, for example, the conductive member 15 is obtained by removing the portion of the base body 10s corresponding to the gate electrode 51 and by providing another conductive layer (a metal layer, etc.) in the removed portion.

In the semiconductor devices 121 and 122, it is desirable for the first electrostatic capacitance of the first capacitance 41 to be not less than 10 times the electrostatic capacitance Cx between the conductive member 15 and the gate electrode 51.

In the semiconductor devices 121 and 122, the electrostatic capacitance Cx is easily reduced because the conductive member 15 is separated from the base body 10s. Even when the first electrostatic capacitance is small, the delay of the threshold voltage increase can be suppressed.

Third Embodiment

A third embodiment corresponds to one example of the first circuit 30 illustrated in FIG. 1.

Figure 8:
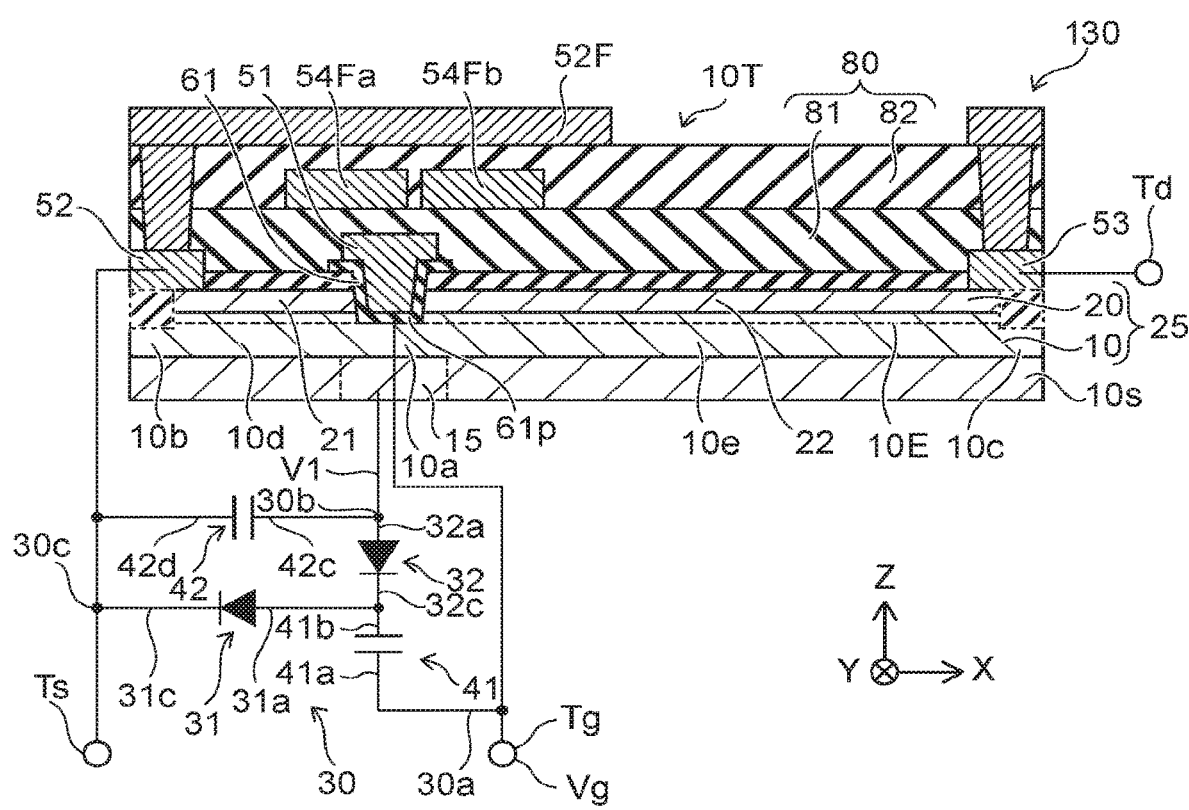
FIG. 8 is a schematic view illustrating a semiconductor device according to a third embodiment.

FIG. 8 is a schematic view illustrating the semiconductor device according to the third embodiment.

Figure 9:
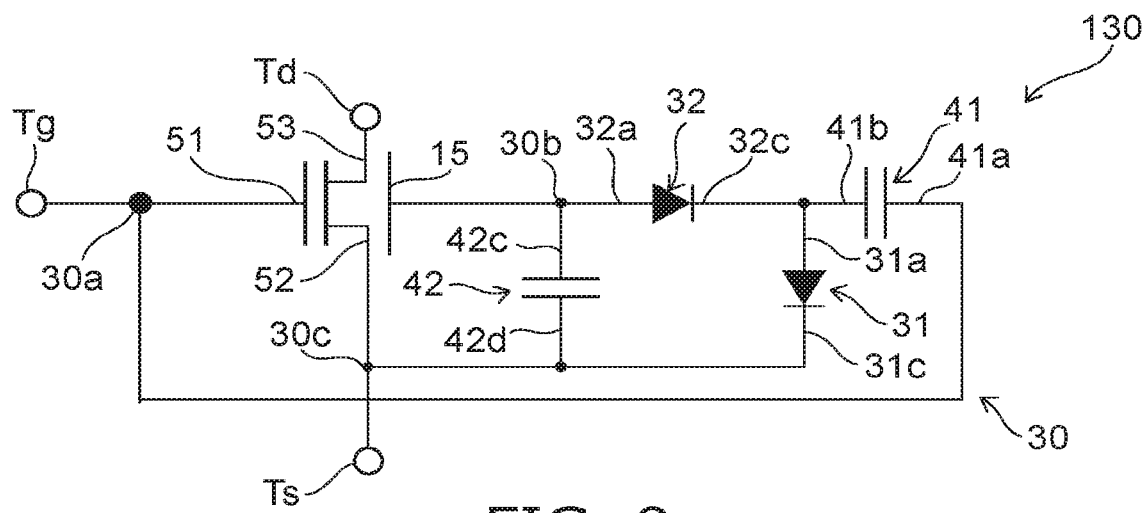
FIG. 9 is a circuit diagram illustrating the semiconductor device according to the third embodiment.

FIG. 9 is a circuit diagram illustrating the semiconductor device according to the third embodiment.

As shown in FIG. 8, the configurations of the semiconductor member 25, the gate electrode 51, the source electrode 52, the drain electrode 53, the conductive member 15, the gate terminal Tg, etc., of the semiconductor device 130 according to the embodiment are similar to those of the semiconductor device 110. An example of the first circuit 30 of the semiconductor device 130 will now be described.

As shown in FIGS. 8 and 9, the first circuit 30 includes the first capacitance 41, a second capacitance 42, a first diode 31, and a second diode 32.

The first capacitance 41 includes the first end portion 41a and the second end portion 41b. The second capacitance 42 includes a third end portion 42c and a fourth end portion 42d. The first diode 31 includes the first anode 31a and the first cathode 31c. The second diode 32 includes a second anode 32a and a second cathode 32c.

The first end portion 41a is electrically connected to the gate terminal Tg. The second end portion 41b is electrically connected to the first anode 31a and the second cathode 32c. The first cathode 31c is electrically connected to the source electrode 52. The second anode 32a is electrically connected to the conductive member 15 and the third end portion 42c. The fourth end portion 42d is electrically connected to the source electrode 52.

In such a first circuit 30 as well, the first voltage V1 is generated from the gate voltage Vg.

Figure 10A:
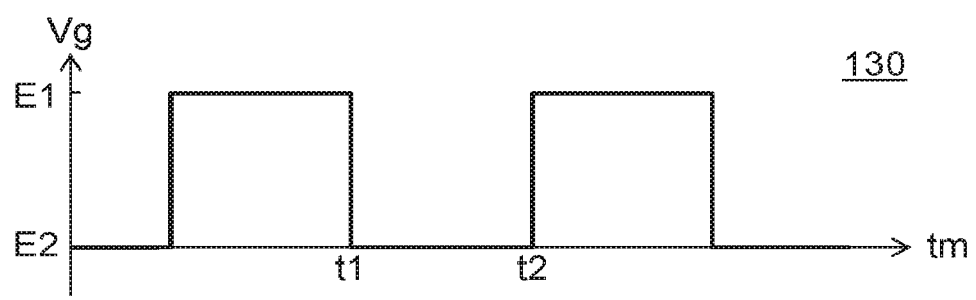
FIGS. 10A and 10B are graphs illustrating an operation of the semiconductor device according to the third embodiment.
Figure 10B:
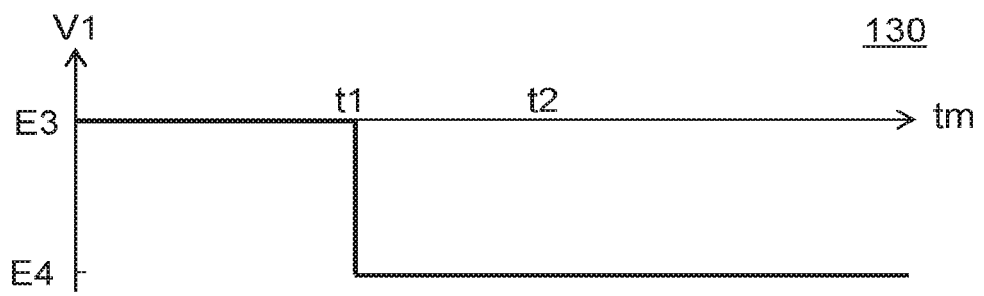

FIGS. 10A and 10B are graphs illustrating an operation of the semiconductor device according to the third embodiment.

In these figures, the horizontal axis is the time tm. The vertical axis of FIG. 10A is the gate voltage Vg applied to the gate terminal Tg. The vertical axis of FIG. 10B is the first voltage V1 applied to the conductive member 15.

As shown in FIG. 10A, the gate voltage Vg changes from the first potential E1 to the second potential E2 at the first time t1. The second potential E2 is less than the first potential E1.

As shown in FIG. 10B, the first voltage V1 changes from the third potential E3 to the fourth potential E4 at the first time t1. The fourth potential E4 is less than the third potential E3. The second potential E2 and the third potential E3 are, for example, the ground potential. The first voltage V1 that is output from the first circuit 30 changes to the negative fourth potential E4 when the gate voltage Vg changes from the positive first potential E1 to the ground potential.

Thus, the first voltage V1 changes from the third potential E3 to the fourth potential E4 at the first time t1 when the gate voltage Vg changes from the first potential E1 (the high potential) to the second potential E2 (the low potential). A high threshold voltage is obtained thereby.

In the semiconductor device 130, the first voltage V1 maintains the fourth potential E4 at and after the first time t1. The first voltage V1 maintains the fourth potential E4 when the gate voltage Vg changes from the second potential E2 to the first potential E1. Even at the second time t2, the first voltage V1 maintains the negative fourth potential E4. The semiconductor device 130 is not affected by the delay of the change of the first voltage V1 with respect to the change of the gate voltage Vg. A high threshold voltage is more stably obtained.

It is sufficient for a second electrostatic capacitance of the second capacitance 42 to be substantially equal to the first electrostatic capacitance of the first capacitance 41. For example, the second electrostatic capacitance is not less than 0.7 times and not more than 1.3 times the first electrostatic capacitance.

In the embodiment, it is favorable for the second electrostatic capacitance of the second capacitance 42 to be not less than 10 times the electrostatic capacitance between the gate electrode 51 and the conductive member 15 (which may be, for example, the base body 10s). The fourth potential E4 can be further reduced thereby, and a high threshold voltage is obtained.

Figure 11:
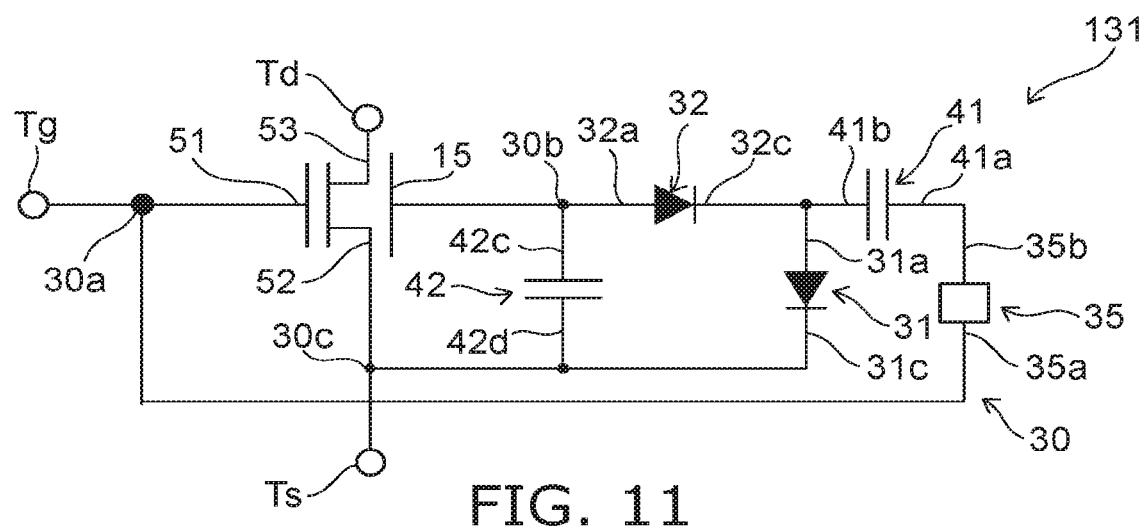
FIG. 11 is a circuit diagram illustrating a semiconductor device according to the third embodiment.

FIG. 11 is a circuit diagram illustrating a semiconductor device according to the third embodiment.

In the semiconductor device 131 according to the embodiment as shown in FIG. 11, the first circuit 30 includes a voltage amplifier circuit 35 in addition to the first capacitance 41, the second capacitance 42, the first diode 31, and the second diode 32. The voltage amplifier circuit 35 includes an input end 35a and an output end 35b. The input end 35a is electrically connected to the gate terminal Tg. The output end 35b is electrically connected to the first end portion 41a. In the semiconductor device 131, the first voltage V1 that is amplified can be applied to the conductive member 15. A high threshold is stably obtained.

Figure 12:
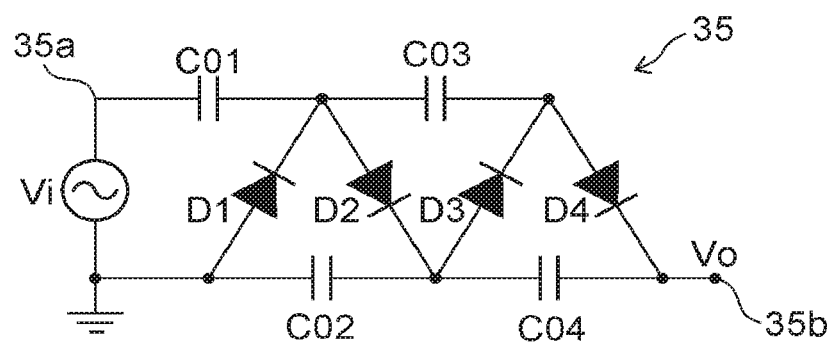
FIG. 12 is a circuit diagram illustrating the semiconductor device according to the third embodiment.

FIG. 12 is a circuit diagram illustrating the semiconductor device according to the third embodiment.

FIG. 12 shows an example of the voltage amplifier circuit 35. As shown in FIG. 12, the voltage amplifier circuit is obtained by combining diodes D1 to D4 and capacitances C01 to C04. An amplified output voltage Vo is obtained based on an input voltage Vi.

Fourth Embodiment

Figure 13:
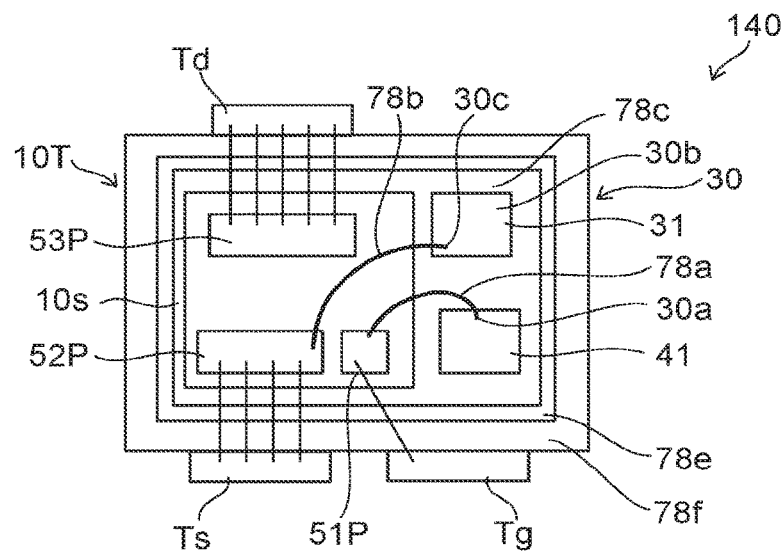
FIG. 13 is a schematic view illustrating a semiconductor device according to a fourth embodiment.

FIG. 13 is a schematic view illustrating a semiconductor device according to a fourth embodiment.

FIG. 13 is a schematic plan view. In the semiconductor device 140 as shown in FIG. 13, the first circuit 30 is provided on a mounting substrate 78e. In the example, the first circuit 30 includes the first diode 31 and the first capacitance 41. For example, a conductive layer 78c is provided on the mounting substrate 78e. The first diode 31, the first capacitance 41, and the transistor 10T are provided on the conductive layer 78c. The transistor 10T includes the semiconductor member 25, the gate electrode 51, the source electrode 52, and the drain electrode 53 (referring to FIG. 1). A gate pad 51P, a source pad 52P, and a drain pad 53P are provided for the transistor 10T. The gate pad 51P is electrically connected to the gate electrode 51. The source pad 52P is electrically connected to the source electrode 52. The drain pad 53P is electrically connected to the drain electrode 53.

For example, the gate pad 51P and the first capacitance 41 are electrically connected by a connection member 78a. For example, the source pad 52P and the first diode 31 are electrically connected by a connection member 78b. The first capacitance 41 and the first diode 31 are electrically connected by the conductive layer 78c.

For example, these electrical components may be surrounded with a mold resin 78f. For example, the gate terminal Tg, the source terminal Ts, and the drain terminal Td may not be covered with the mold resin 78f.

Fifth Embodiment

In a fifth embodiment, the diode and the capacitance are formed of materials included in the transistor 10T.

Figure 14:
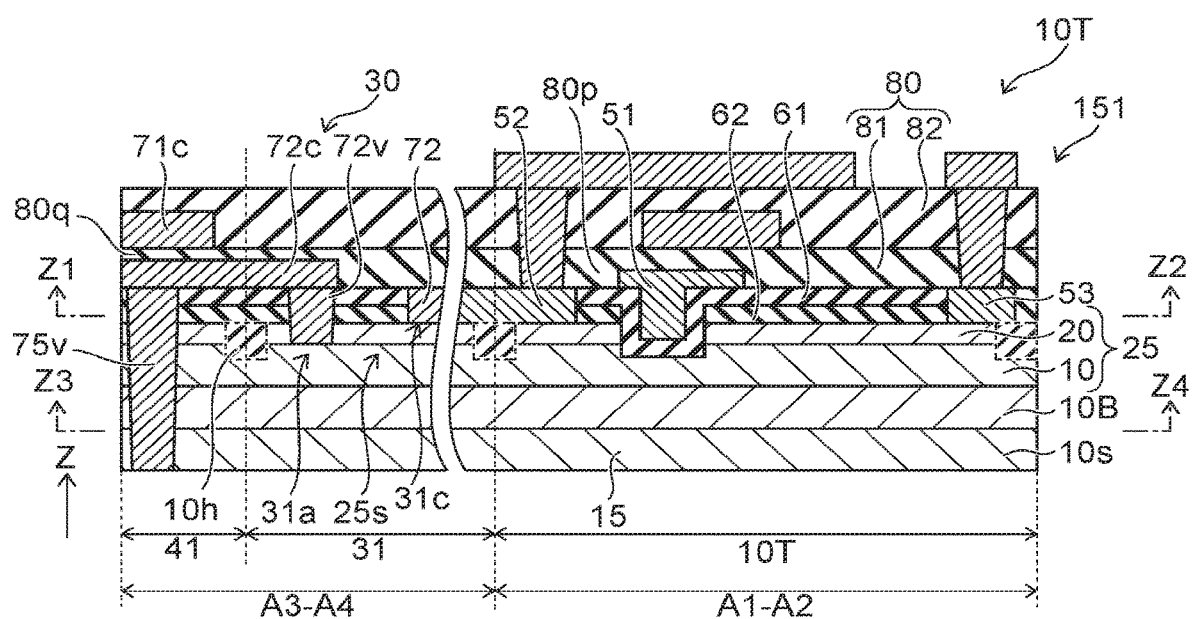
FIG. 14 is a schematic cross-sectional view illustrating a semiconductor device according to a fifth embodiment.

FIG. 14 is a schematic cross-sectional view illustrating the semiconductor device according to the fifth embodiment.

Figure 15:
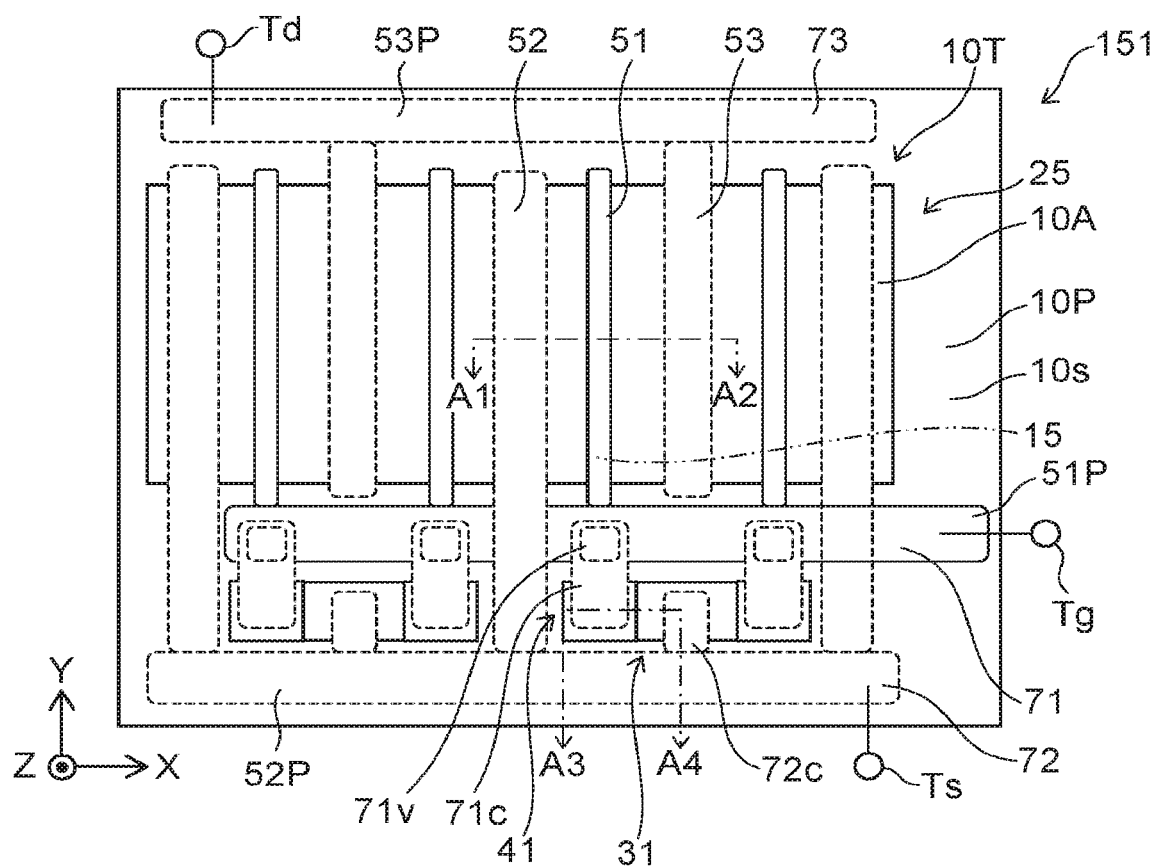
FIG. 15 is a schematic plan view illustrating the semiconductor device according to the fifth embodiment.
Figure 16:
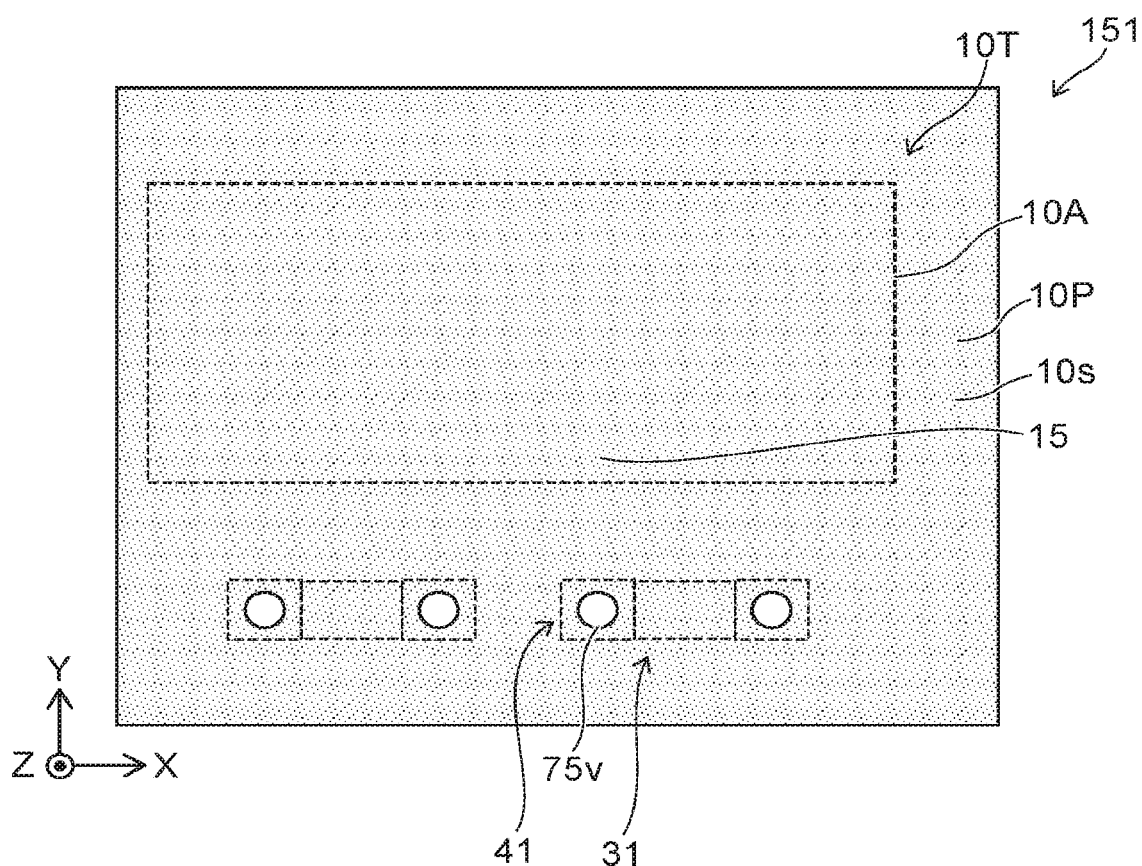
FIG. 16 is a schematic plan view illustrating the semiconductor device according to the fifth embodiment.

FIGS. 15 and 16 are schematic plan views illustrating the semiconductor device according to the fifth embodiment. FIG. 14 illustrates a line A1-A2 cross section and a line A3-A4 cross section of FIG. 15. FIG. 15 illustrates a plane at the position of line Z1-Z2 of FIG. 14. FIG. 16 illustrates a plane at the position of line Z3-Z4 of FIG. 14.

In the semiconductor device 151 illustrated in FIG. 14, the first diode 31 and the first capacitance 41 are provided as the first circuit 30. The semiconductor device 151 corresponds to one example of the semiconductor device 120.

As shown in FIG. 15, an active region 10A and a peripheral region 10P are provided in the semiconductor member 25. The peripheral region 10P is provided around the active region 10A. Multiple gate electrodes 51, multiple source electrodes 52, and multiple drain electrodes 53 are provided in the example. These regions extend in the Y-axis direction on the active region 10A. The gate pad 51P, the source pad 52P, and the drain pad 53P are provided in the peripheral region 10P. The gate pad 51P is electrically connected to the multiple gate electrodes 51. For example, the electrical connection is performed by a gate interconnect 71. The source pad 52P is electrically connected to the multiple source electrodes 52. For example, the electrical connection is performed by a source interconnect 72. The drain pad 53P is electrically connected to the multiple drain electrodes 53. For example, the electrical connection is performed by a drain interconnect 73. For example, the gate terminal Tg is electrically connected to the gate pad 51P. For example, the source terminal Ts is electrically connected to the source pad 52P. For example, the drain terminal Td is electrically connected to the drain pad 53P.

As shown in FIG. 15, an interconnect 71c is electrically connected to the gate interconnect 71 by a connection member 71v. An interconnect 72c is electrically connected to the source interconnect 72.

As shown in FIG. 14, the first insulating member 81 is provided between the interconnect 71c and the interconnect 72c. The first capacitance 41 is formed of the first insulating member 81, the interconnect 71c, and the interconnect 72c.

As shown in FIGS. 14 and 16, a portion of the interconnect 72c is electrically connected to the base body 10s (the conductive member 15) by a connection member 75v. The connection member 75v corresponds to the second end portion 41b of the first capacitance 41. In the example as shown in FIGS. 14 and 16, the conductive member 15 corresponds to the base body 10s.

As shown in FIG. 14, a portion of the interconnect 72c is electrically connected to the semiconductor member 25 by a connection member 72v. The first diode 31 is formed of the connection member 72v, the semiconductor member 25, and the source interconnect 72. The connection member 72v corresponds to the first anode 31a. The source interconnect 72 corresponds to the first cathode 31c.

Thus, the first diode 31 may include a semiconductor layer 25s that is included in the semiconductor member 25.

A portion 80p of the insulating member 80 (in the example, the first insulating member 81) electrically insulates the gate electrode 51 and the source electrode 52. The first capacitance 41 may include another portion 80q of such an insulating member 80 (e.g., the first insulating member 81).

As shown in FIG. 14, the transistor 10T of the semiconductor device 151 may further include a second insulating film 62. The second insulating film 62 is provided between the second semiconductor layer 20 and a portion of the first insulating film 61 in the Z-axis direction. For example, the second insulating film 62 may function as a protective film of the semiconductor member 25. The second insulating film 62 includes, for example, silicon nitride, etc.

Figure 17:
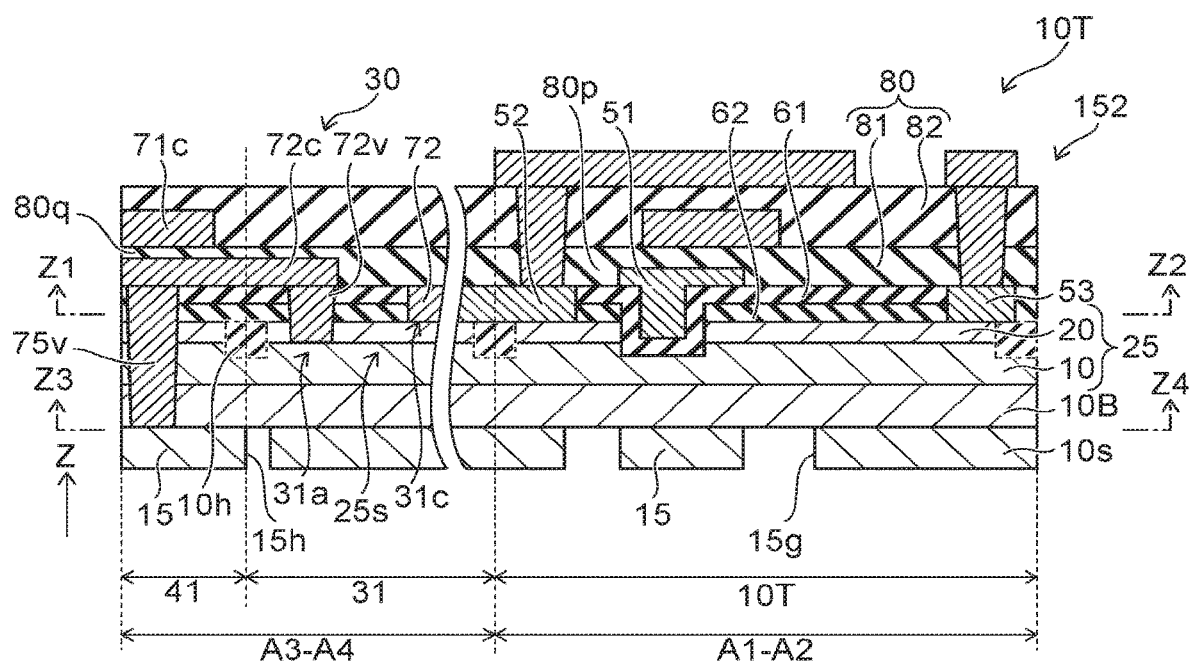
FIG. 17 is a schematic cross-sectional view illustrating a semiconductor device according to the fifth embodiment.

FIG. 17 is a schematic cross-sectional view illustrating a semiconductor device according to the fifth embodiment.

Figure 18:
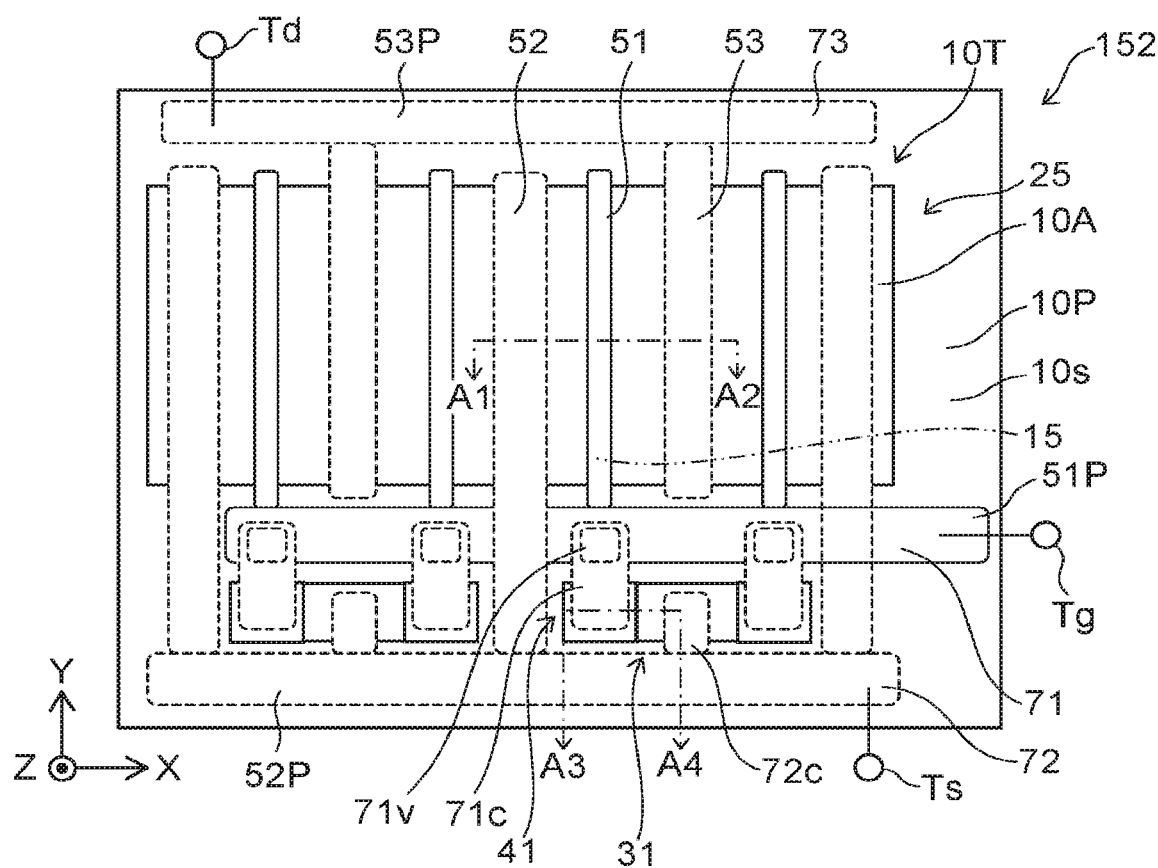
FIG. 18 is a schematic plan view illustrating the semiconductor device according to the fifth embodiment.
Figure 19:
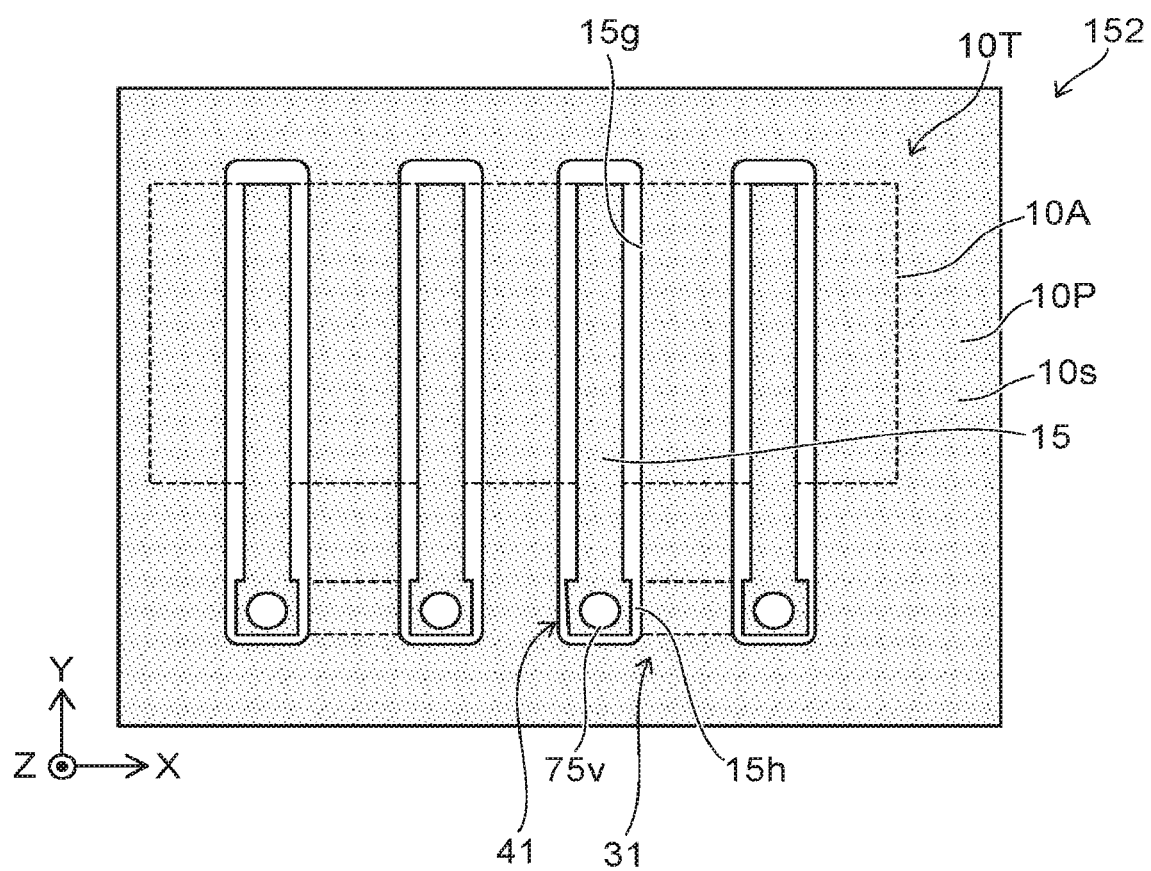
FIG. 19 is a schematic plan view illustrating the semiconductor device according to the fifth embodiment.

FIGS. 18 and 19 are schematic plan views illustrating the semiconductor device according to the fifth embodiment. FIG. 17 illustrates a line A1-A2 cross section and a line A3-A4 cross section of FIG. 18. FIG. 18 illustrates a plane at the position of line Z1-Z2 of FIG. 17. FIG. 19 illustrates a plane at the position of line Z3-Z4 of FIG. 17.

In the semiconductor device 152 illustrated in FIG. 17, the first diode 31 and the first capacitance 41 are provided as the first circuit 30. The semiconductor device 152 corresponds to one example of the semiconductor device 121. Examples of portions of the semiconductor device 152 that are different from those of the semiconductor device 151 will now be described.

In the semiconductor device 152 as shown in FIG. 17, the conductive member 15 is separated from the base body 10s. For example, as shown in FIGS. 17 and 19, a gap 15g is provided between the conductive member 15 and the base body 10s.

As shown in FIGS. 17 and 19, the conductive member 15 at the lower portion of the connection member 75v also is separated from the base body 10s by a gap 15h. In the semiconductor device 152, the electrostatic capacitance Cx can be small (referring to FIG. 6).

In the semiconductor device 152 as well, the first capacitance 41 is formed of a portion 80q of the first insulating member 81, the interconnect 71c, and the interconnect 72c. The first diode 31 is formed of the connection member 72v, the semiconductor member 25, and the source interconnect 72.

Figure 20:
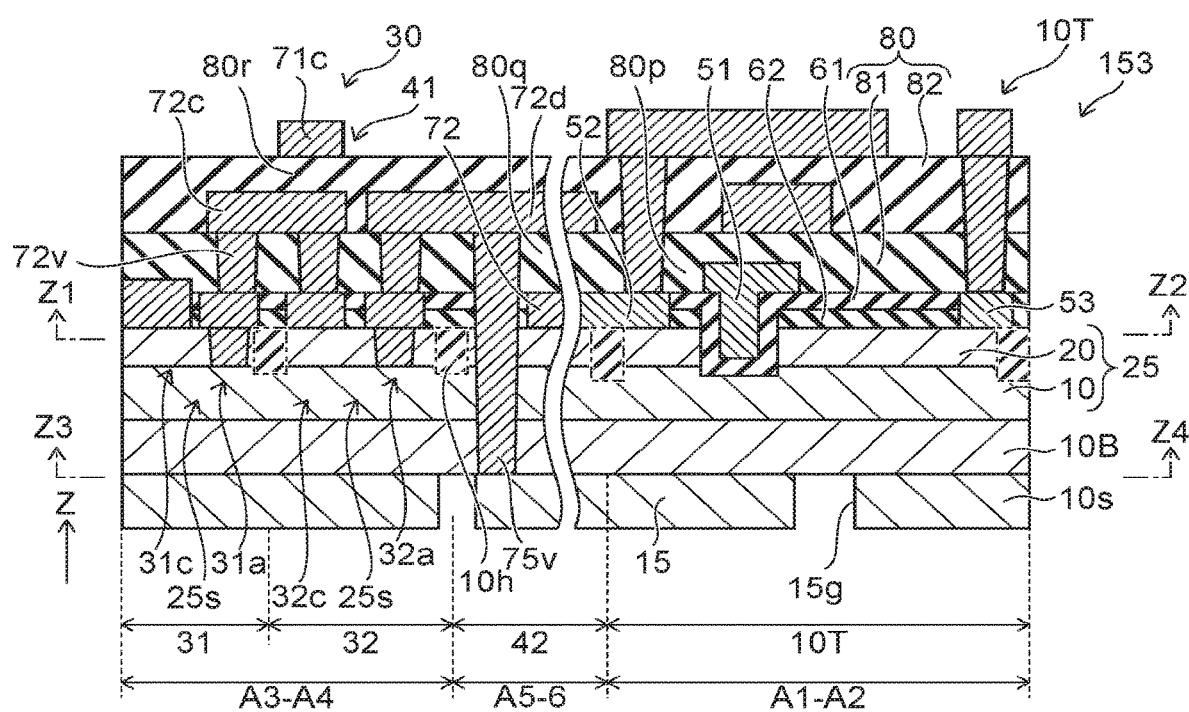
FIG. 20 is a schematic cross-sectional view illustrating a semiconductor device according to the fifth embodiment.

FIG. 20 is a schematic cross-sectional view illustrating a semiconductor device according to the fifth embodiment.

Figure 21:
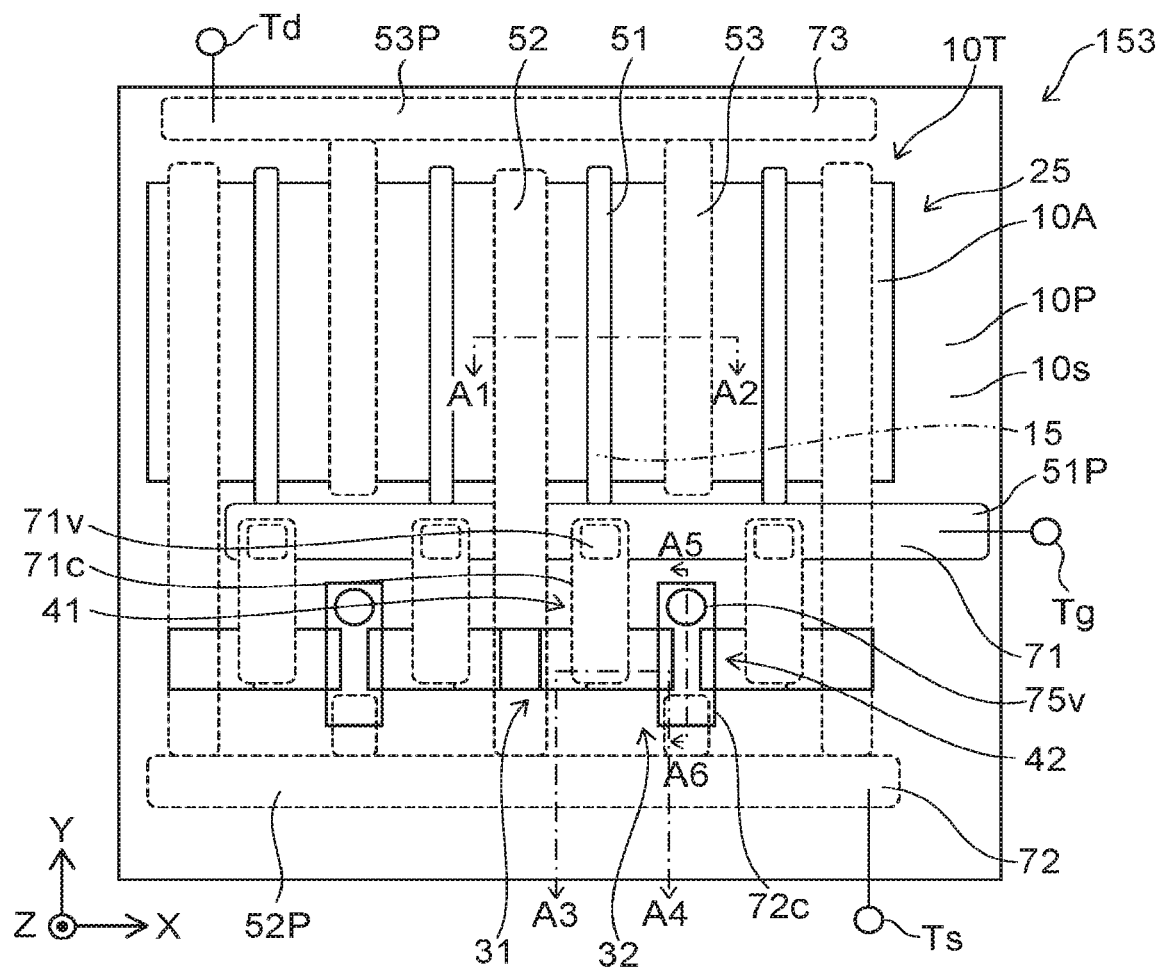
FIG. 21 is a schematic plan view illustrating the semiconductor device according to the fifth embodiment.
Figure 22:
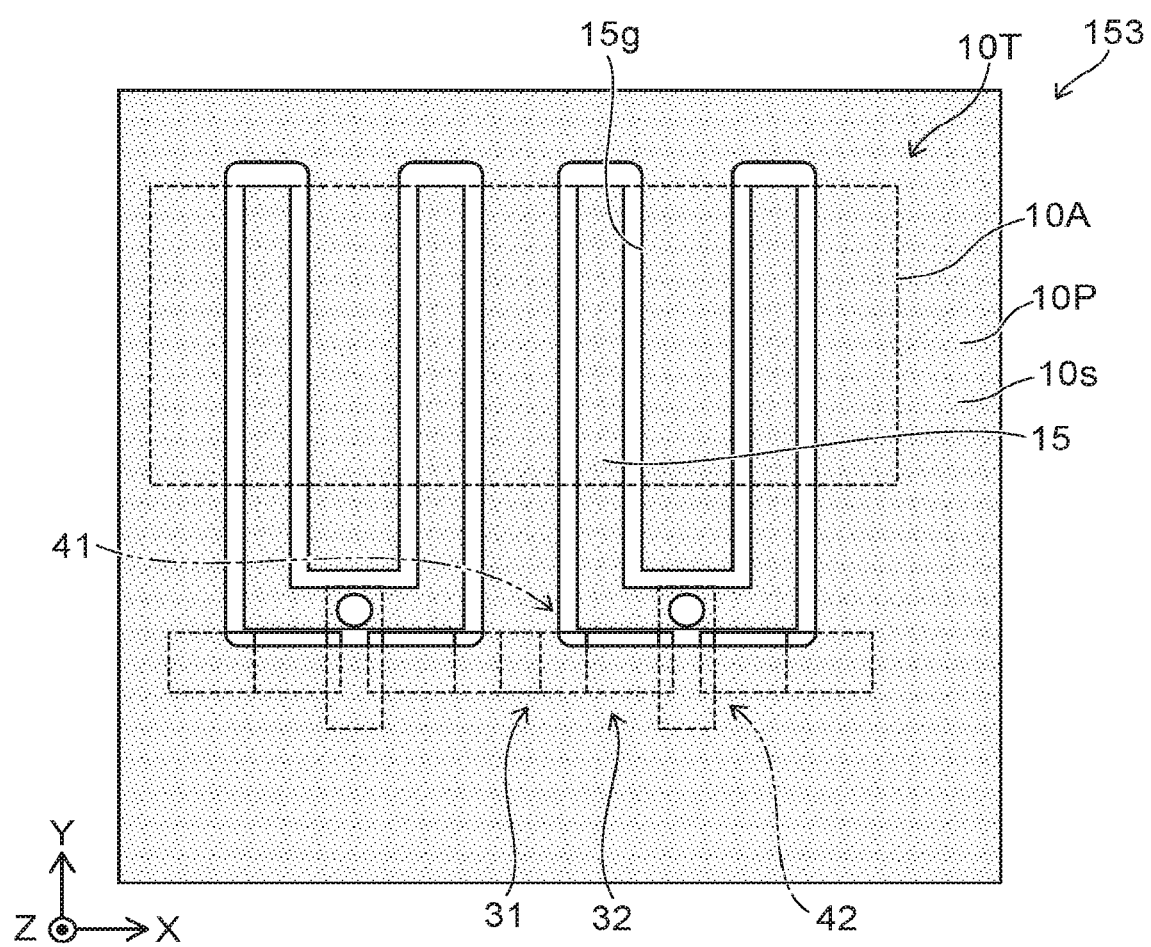
FIG. 22 is a schematic plan view illustrating the semiconductor device according to the fifth embodiment.

FIGS. 21 and 22 are schematic plan views illustrating the semiconductor device according to the fifth embodiment. FIG. 20 illustrates a line A1-A2 cross section, a line A3-A4 cross section, and a line A5-A6 cross section of FIG. 21. FIG. 21 illustrates a plane at the position of line Z1-Z2 of FIG. 20. FIG. 22 illustrates a plane at the position of line Z3-Z4 of FIG. 20.

In the semiconductor device 153 illustrated in FIG. 20, the first diode 31, the second diode 32, the first capacitance 41, and the second capacitance 42 are provided as the first circuit 30. The semiconductor device 153 corresponds to one example of the semiconductor device 130.

As shown in FIG. 20, a portion 80r of the first insulating member 81 is provided between the interconnect 72c and the interconnect 71c. An interconnect 72d is electrically connected to the base body 10s (the conductive member 15) by the connection member 75v. The portion 80q of the insulating member 80 is provided between the source interconnect 72 and the interconnect 72d.

As shown in FIG. 20, the first capacitance 41 includes the portion 80r of the first insulating member 81. The second capacitance 42 includes the portion 80q of the first insulating member 81. The first diode 31 includes a portion of the semiconductor layer 25s. The second diode 32 includes another portion of the semiconductor layer 25s.

According to the embodiments, a semiconductor device can be provided in which the characteristics can be improved.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor layers, electrodes, conductive members, base bodies, terminals, insulating members, insulating films, circuits, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a semiconductor member including
   a first semiconductor layer including a first partial region and including $Al_{x1}Ga_{1-x1}N$ ($0 \leq x1 < 1$), and
   a second semiconductor layer including $Al_{x2}Ga_{1-x2}N$ ($0 < x2 \leq 1$ and $x1 < x2$);
a gate electrode;
a source electrode;
a drain electrode;
a conductive member, the first partial region being between the gate electrode and at least a portion of the conductive member in a first direction;
a gate terminal electrically connected to the gate electrode; and
a first circuit configured to apply a first voltage to the conductive member based on a gate voltage applied to the gate terminal, the first voltage having a reverse polarity of a polarity of the gate voltage,
wherein the first circuit includes:
   a first capacitance including a first end portion and a second end portion; and
   a first diode including a first anode and a first cathode,
the first end portion is electrically connected to the gate terminal,
the second end portion is electrically connected to the conductive member and the first anode, and
the first cathode is electrically connected to the source electrode.

2. The device according to claim 1, wherein
the first circuit generates the first voltage from the gate voltage.

3. The device according to claim 1, wherein
the first voltage changes from a third potential to a fourth potential when the gate voltage changes from a first potential to a second potential,
the second potential is less than the first potential, and
the fourth potential is less than the third potential.

4. The device according to claim 3, wherein
the first voltage changes from the fourth potential to the third potential when the gate voltage changes from the second potential to the first potential.

5. The device according to claim 3, wherein
the first voltage maintains the fourth potential when the gate voltage changes from the second potential to the first potential.

6. The device according to claim 1, wherein
a first electrostatic capacitance of the first capacitance is not less than 10 times an electrostatic capacitance between the conductive member and the gate electrode.

7. The device according to claim 1, wherein
the first diode includes a semiconductor layer included in the semiconductor member.

8. The device according to claim 1, further comprising:
an insulating member,
a portion of the insulating member electrically insulating the gate electrode and the source electrode,
the first capacitance including an other portion of the insulating member.

9. The device according to claim 1, wherein
the first circuit includes:
   a first capacitance including a first end portion and a second end portion;
   a second capacitance including a third end portion and a fourth end portion;
   a first diode including a first anode and a first cathode; and a second diode including a second anode and a second cathode,
the first end portion is electrically connected to the gate terminal,
the second end portion is electrically connected to the first anode and the second cathode,
the first cathode is electrically connected to the source electrode,
the second anode is electrically connected to the conductive member and the third end portion, and
the fourth end portion is electrically connected to the source electrode.

10. The device according to claim 1, wherein
the first circuit includes:
a first capacitance including a first end portion and a second end portion;
a second capacitance including a third end portion and a fourth end portion;
a first diode including a first anode and a first cathode;
a second diode including a second anode and a second cathode; and
a voltage amplifier circuit including an input end and an output end,
the input end is electrically connected to the gate terminal,
the output end is electrically connected to the first end portion,
the second end portion is electrically connected to the first anode and the second cathode,
the first cathode is electrically connected to the source electrode,
the second anode is electrically connected to the conductive member and the third end portion, and
the fourth end portion is electrically connected to the source electrode.

11. The device according to claim 10, wherein
a second electrostatic capacitance of the second capacitance is not less than 10 times an electrostatic capacitance between the conductive member and the gate electrode.

12. The device according to claim 1, wherein
the conductive member spreads along a plane crossing the first direction,
a portion of the first semiconductor layer is between the source electrode and a portion of the conductive member in the first direction, and
an other portion of the first semiconductor layer is between the drain electrode and an other portion of the conductive member in the first direction.

13. The device according to claim 12, wherein
the conductive member is at least a portion of a silicon substrate.

14. The device according to claim 1, further comprising:
a base body,
a portion of the first semiconductor layer being between the source electrode and a portion of the base body in the first direction,
an other portion of the first semiconductor layer being between the drain electrode and an other portion of the base body in the first direction,
the conductive member being separated from the base body.

15. The device according to claim 1, wherein
a second direction from the source electrode toward the drain electrode crosses the first direction, and
a position in the second direction of the gate electrode is between a position in the second direction of the source electrode and a position in the second direction of the drain electrode.

16. The device according to claim 15, wherein
the first semiconductor layer includes a second partial region, a third partial region, a fourth partial region, and a fifth partial region,
a direction from the second partial region toward the source electrode is along the first direction,
a direction from the third partial region toward the drain electrode is along the first direction,
the first partial region is between the second partial region and the third partial region in the second direction,
the fourth partial region is between the second partial region and the first partial region in the second direction,
the fifth partial region is between the first partial region and the third partial region in the second direction,
the second semiconductor layer includes a first semiconductor portion and a second semiconductor portion,
a direction from the fourth partial region toward the first semiconductor portion is along the first direction, and
a direction from the fifth partial region toward the second semiconductor portion is along the first direction.

17. The device according to claim 16, further comprising:
a first insulating film,
at least a portion of the first insulating film being between the first partial region and the gate electrode.

18. The device according to claim 1, wherein
a direction from at least a portion of the gate electrode toward at least a portion of the second semiconductor layer is perpendicular to the first direction.

19. The device according to claim 1, wherein
the device is normally-off.

* * * * *